United States Patent
Rofougaran et al.

(10) Patent No.: US 8,005,436 B2
(45) Date of Patent: *Aug. 23, 2011

(54) METHOD AND SYSTEM FOR INTEGRATED BLUETOOTH TRANSCEIVER, FM TRANSMITTER AND FM RECEIVER

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

(*) Notice: Subject to any disclaimer, the term of this patent is extended or adjusted under 35 U.S.C. 154(b) by 925 days.

This patent is subject to a terminal disclaimer.

(21) Appl. No.: 11/754,490

(22) Filed: May 29, 2007

(65) Prior Publication Data

US 2008/0233864 A1    Sep. 25, 2008

Related U.S. Application Data

(60) Provisional application No. 60/895,698, filed on Mar. 19, 2007.

(51) Int. Cl.
  *H04B 1/40* (2006.01)
  *H04M 1/00* (2006.01)
(52) U.S. Cl. .......... 455/76; 455/77; 455/550.1
(58) Field of Classification Search .......... 455/41.2, 455/76, 77, 550.1, 93, 110, 118, 142, 165.1, 455/183.1, 192.1, 260
See application file for complete search history.

(56) References Cited

U.S. PATENT DOCUMENTS

| | | | |
|---|---|---|---|
| 6,907,089 B2* | 6/2005 | Jensen et al. | 375/324 |
| 7,020,486 B2* | 3/2006 | Tanada et al. | 455/552.1 |
| 7,548,742 B2* | 6/2009 | Johnson | 455/313 |
| 2001/0033200 A1* | 10/2001 | Staszewski et al. | 331/18 |
| 2004/0185857 A1* | 9/2004 | Lee et al. | 455/445 |
| 2005/0107103 A1* | 5/2005 | Melpignano | 455/502 |
| 2006/0025096 A1* | 2/2006 | Jaffe et al. | 455/260 |
| 2007/0046516 A1* | 3/2007 | Dornbusch | 341/143 |
| 2008/0232507 A1* | 9/2008 | Rofougaran et al. | 375/295 |
| 2008/0232522 A1* | 9/2008 | Rofougaran et al. | 375/355 |
| 2008/0233872 A1* | 9/2008 | Rofougaran et al. | 455/41.2 |
| 2008/0233873 A1* | 9/2008 | Rofougaran et al. | 455/41.2 |
| 2008/0233874 A1* | 9/2008 | Rofougaran et al. | 455/41.2 |
| 2008/0233891 A1* | 9/2008 | Rofougaran et al. | 455/76 |

* cited by examiner

*Primary Examiner* — Andrew Wendell
(74) *Attorney, Agent, or Firm* — McAndrews, Held & Malloy, Ltd.

(57) ABSTRACT

An integrated circuit may enable transmission and reception of Bluetooth signals as well as FM signals. One or more clock signals may be generated via a phase-locked loop and may be utilized to enable Bluetooth transmission and reception. Bluetooth clock signals and frequency control words may be utilized by a direct digital frequency synthesizer to generate FM carrier signals that enable FM reception as well as digitally modulated signals for FM transmission. FM reception and transmission may be time division duplex. Frequency control words may be adjusted to compensate for variations in the Bluetooth clock signal frequency for FM carrier signals used in FM reception. Moreover, frequency control words may be adjusted to modulate a signal about the frequency of an FM carrier for transmission. Each of the Bluetooth clock signals, carrier signals and modulated signals comprise an in-phase component and a quadrature-phase component.

27 Claims, 6 Drawing Sheets

METHOD AND SYSTEM FOR INTEGRATED BLUETOOTH TRANSCEIVER, FM TRANSMITTER AND FM RECEIVER

CROSS-REFERENCE TO RELATED APPLICATIONS/INCORPORATION BY REFERENCE

This application makes reference to and claims priority to U.S. Provisional Application Ser. No. 60/895,698 which was filed on Mar.19, 2007, entitled "METHOD AND SYSTEM FOR SINGLE CHIP BLUETOOTH, FM TRANSMIT, AND FM RECEIVE FUNCTION," which is incorporated herein by reference in its entirety.

This application makes reference to:
U.S. application Ser. No. 11/286,555 filed on Nov.22, 2005;
U.S. application Ser. No. 11/754,481 filed on May 29, 2007;
U.S. application Ser. No. 11/754,460 filed on May 29, 2007;
U.S. application Ser. No. 11/754,581 filed on May 29, 2007;
U.S. application Ser. No. 11/754,621 filed on May 29, 2007;
U.S. application Ser. No. 11/754,708 filed on May 29, 2007;
U.S. application Ser. No. 11/754,768 filed on May 29, 2007;
U.S. application Ser. No. 11/754,705 filed on May 29, 2007;
U.S. application Ser. No. 11/754,600 filed on May 29, 2007;
U.S. application Ser. No. 11/754,499 filed on May 29, 2007;
U.S. application Ser. No. 11/754,407 filed on May 29, 2007; and
U.S. application Ser. No. 11/754,438 filed on May 29, 2007.

Each of the above stated applications is hereby incorporated herein by reference in its entirety.

FEDERALLY SPONSORED RESEARCH OR DEVELOPMENT

[Not Applicable]

[MICROFICHE/COPYRIGHT REFERENCE]

[Not Applicable]

FIELD OF THE INVENTION

Certain embodiments of the invention relate to integrated Bluetooth and FM communication technologies. More specifically, certain embodiments of the invention relate to a method and system for an integrated Bluetooth transceiver, FM transmitter and FM receiver.

BACKGROUND OF THE INVENTION

With the popularity of portable electronic devices and wireless devices that support audio applications, there is a growing need to provide a simple and complete solution for audio communications applications. For example, some users may utilize Bluetooth-enabled devices, such as headphones and/or speakers, to allow them to communicate audio data with their wireless handset while freeing to perform other activities. Other users may have portable electronic devices that may enable them to play stored audio content and/or receive audio content via broadcast communication, for example.

However, integrating multiple audio communication technologies into a single device may be costly. Combining a plurality of different communication services into a portable electronic device or a wireless device may require separate processing hardware and/or separate processing software. Moreover, coordinating the reception and/or transmission of data to and/or from the portable electronic device or a wireless device may require significant processing overhead that may impose certain operation restrictions and/or design challenges. For example, a handheld device such as a cellphone that incorporates Bluetooth may pose certain coexistence problems caused by the close proximity of the Bluetooth and an FM transmitter and receiver.

Furthermore, simultaneous use of a plurality of radios in a handheld may result in significant increases in power consumption. Power being a precious commodity in most wireless mobile devices, combining devices such as a cellular radio, a Bluetooth radio and a WLAN radio requires careful design and implementation in order to minimize battery usage. Additional overhead such as sophisticated power monitoring and power management techniques are required in order to maximize battery life.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for an integrated Bluetooth transceiver, FM transmitter and FM receiver, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for transmitting and receiving Bluetooth (BT) signals and frequency modulated (FM) band signals on an integrated circuit. In one embodiment of the invention, a Bluetooth transceiver circuit, an FM transmitter circuit and an FM receiver circuit share a clock signal generator. In this regard, a Bluetooth phase lock loop and local oscillator circuit (BT PLL/LOGEN) may generate clock signals enabling Bluetooth signal transmission and reception. Bluetooth transmit and receive signals are time division duplex (TDD) and frequency hop within a Bluetooth frequency band.

In addition, clock signals output from the BT PLL/LOGEN may be utilized for processing FM signals. In one aspect of the invention, a direct digital frequency synthesizer (DDFS) may generate FM carrier signals utilized by an FM receiver for demodulation. In another aspect of the invention, the same DDFS may generate digitally modulated FM signals for transmission.

Figure 1A:
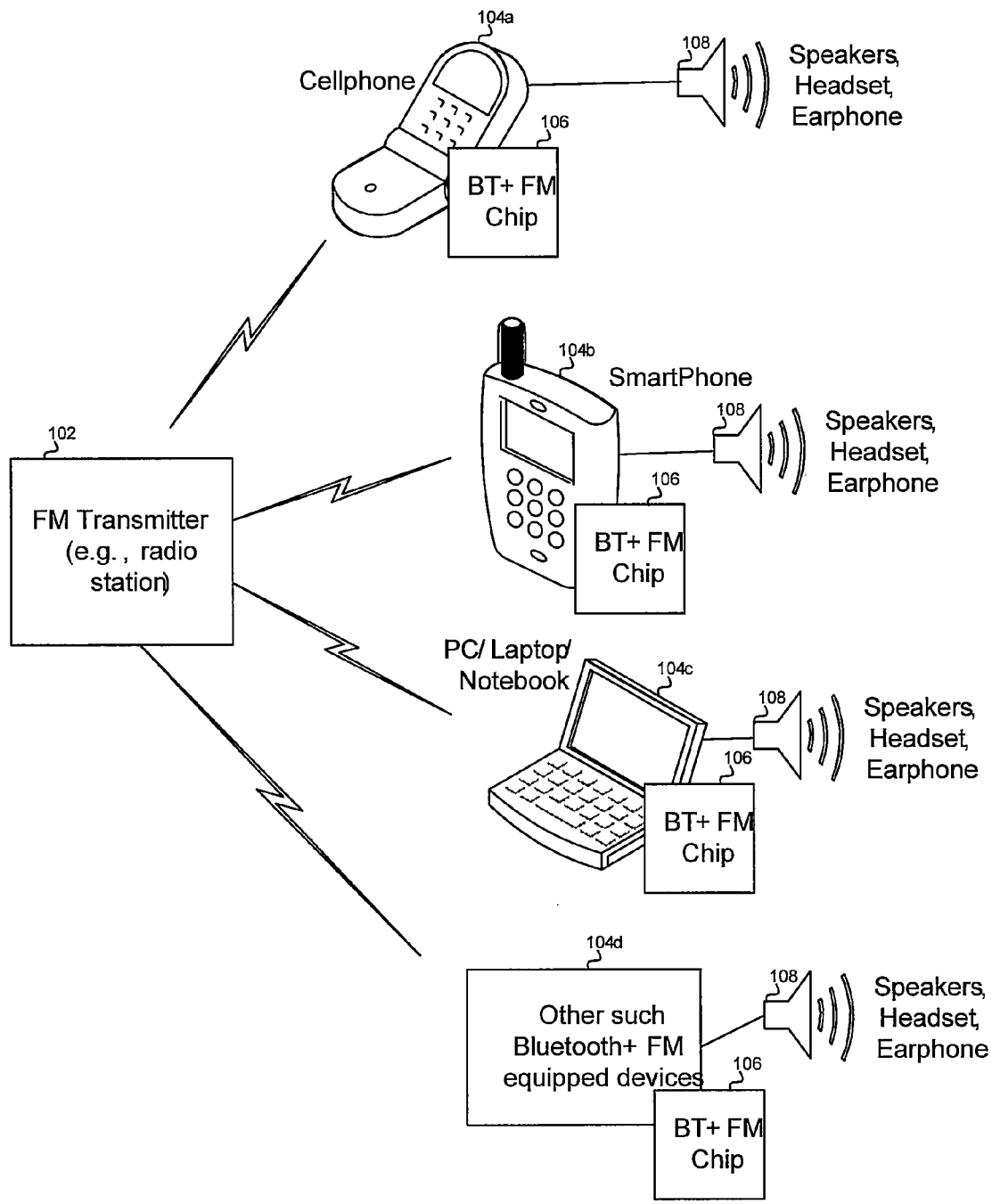
FIG. 1A is a block diagram of an exemplary integrated Bluetooth and FM transmitter that communicates with devices with FM receivers, in accordance with an embodiment of the invention.

FIG. 1A is a block diagram of an exemplary integrated Bluetooth and FM transmitter that communicates with handheld devices that utilize a single chip with integrated Bluetooth and FM radios, in accordance with an embodiment of the invention. Referring to FIG. 1A, there is shown an FM transmitter 102, a cellular phone 104a, a smart phone 104b, a computer 104c, and an exemplary FM and Bluetooth-equipped device 104d. The FM transmitter 102 may be implemented as part of a radio station or other broadcasting device, for example. Each of the cellular phone 104a, the smart phone 104b, the computer 104c, and the exemplary FM and Bluetooth-equipped device 104d may comprise a single chip 106 with integrated Bluetooth and FM radios for supporting FM and Bluetooth data communications. The FM transmitter 102 may enable communication of FM audio data to the devices shown in FIG. 1A by utilizing the single chip 106. Each of the devices in FIG. 1A may comprise and/or may be communicatively coupled to a listening device 108 such as a speaker, a headset, or an earphone, for example.

The cellular phone 104a may be enabled to receive an FM transmission signal from the FM transmitter 102. The user of the cellular phone 104a may then listen to the transmission via the listening device 108. The cellular phone 104a may comprise a "one-touch" programming feature that enables pulling up specifically desired broadcasts, like weather, sports, stock quotes, or news, for example. The smart phone 104b may be enabled to receive an FM transmission signal from the FM transmitter 102. The user of the smart phone 104b may then listen to the transmission via the listening device 108.

The computer 104c may be a desktop, laptop, notebook, tablet, and a PDA, for example. The computer 104c may be enabled to receive an FM transmission signal from the FM transmitter 102. The user of the computer 104c may then listen to the transmission via the listening device 108. The computer 104c may comprise software menus that configure listening options and enable quick access to favorite options, for example. In one embodiment of the invention, the computer 104c may utilize an atomic clock FM signal for precise timing applications, such as scientific applications, for example. While a cellular phone, a smart phone, computing devices, and other devices have been shown in FIG. 1A, the single chip 106 may be utilized in a plurality of other devices and/or systems that receive and use Bluetooth and/or FM signals. In one embodiment of the invention, the single chip Bluetooth and FM radio may be utilized in a system comprising a WLAN radio. The U.S. application Ser. No. 11/286,844, filed on Nov. 22, 2005, discloses a method and system comprising a single chip Bluetooth and FM radio integrated with a wireless LAN radio, and is hereby incorporated herein by reference in its entirety.

Figure 1B:
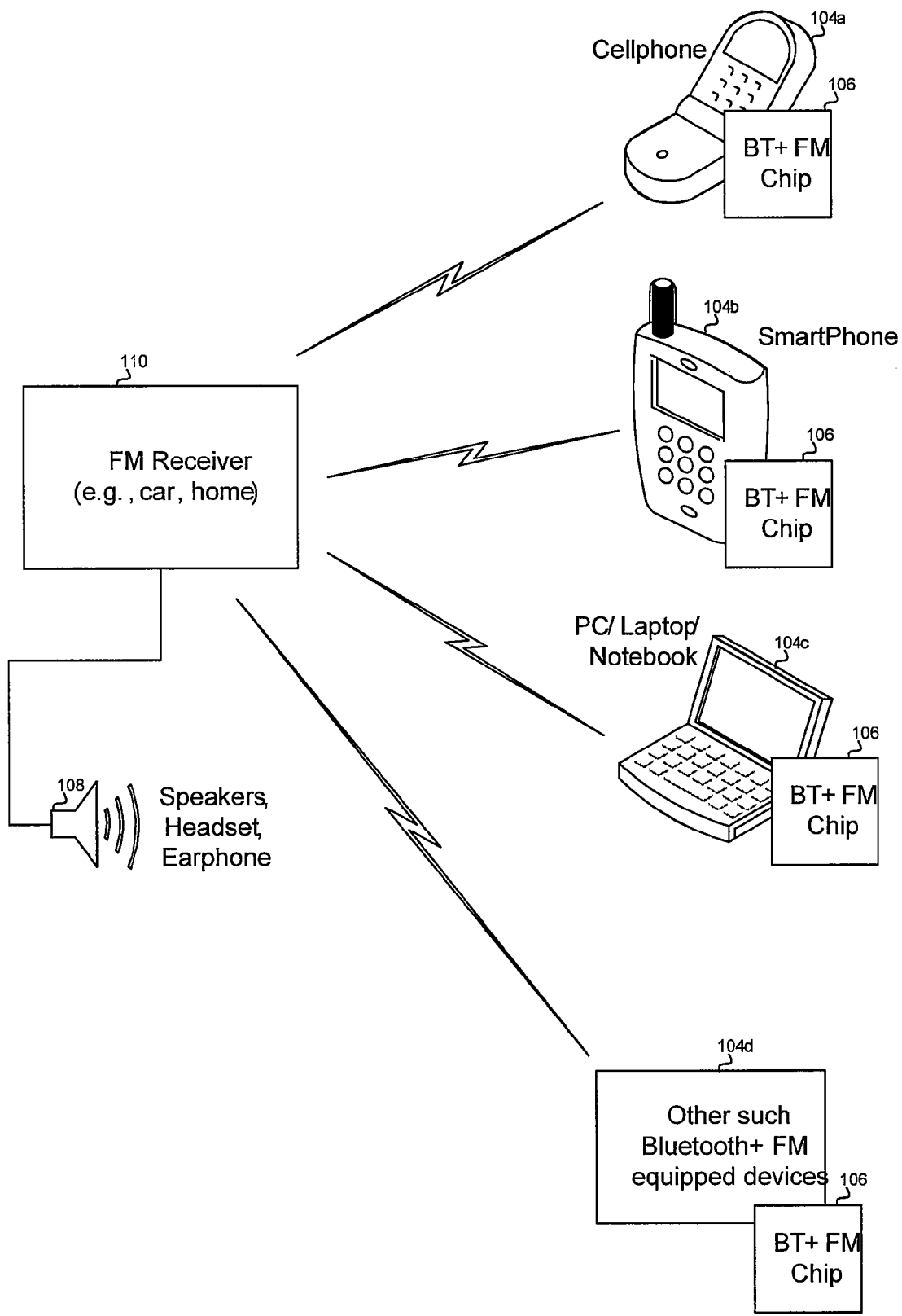
FIG. 1B is a block diagram of an exemplary integrated Bluetooth and FM receiver that communicates with devices transmitting a plurality of FM channels, in accordance with an embodiment of the invention.

FIG. 1B is a block diagram of an exemplary integrated Bluetooth and FM receiver that communicates with handheld devices that utilize a single chip with integrated Bluetooth and FM radios, in accordance with an embodiment of the invention. Referring to FIG. 1B, there is shown an FM receiver 110, the cellular phone 104a, the smart phone 104b, the computer 104c, and the exemplary FM and Bluetooth-equipped device 104d. In this regard, the FM receiver 110 may comprise and/or may be communicatively coupled to a listening device 108. A device equipped with the Bluetooth and FM transceivers, such as the single chip 106, may be able to broadcast its respective signal to a "deadband" of an FM receiver for use by the associated audio system. For example, a cellphone or a smart phone, such as the cellular phone 104a and the smart phone 104b, may transmit a telephone call for listening over the audio system of an automobile, via usage of a deadband area of the car's FM stereo system. One advantage may be the universal ability to use this feature with all automobiles equipped simply with an FM radio with few, if any, other external FM transmission devices or connections being required.

In another example, a computer, such as the computer 104c, may comprise an MP3 player or another digital music format player and may broadcast a signal to the deadband of an FM receiver in a home stereo system. The music on the computer may then be listened to on a standard FM receiver with few, if any, other external FM transmission devices or connections. While a cellular phone, a smart phone, and computing devices have been shown, a single chip that combines a Bluetooth and FM transceiver and/or receiver may be utilized in a plurality of other devices and/or systems that receive and use an FM signal.

Figure 1C:
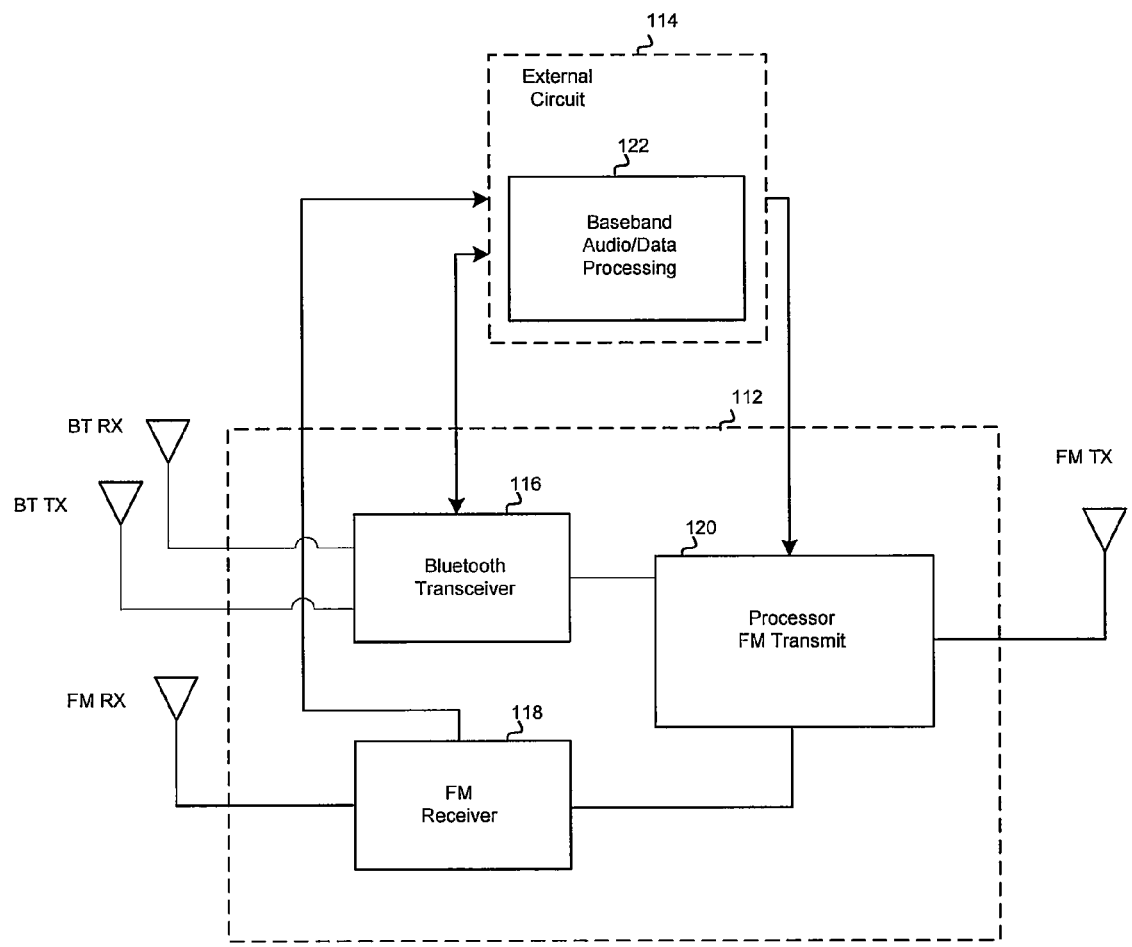
FIG. 1C is a block diagram of an exemplary single chip with integrated Bluetooth and FM radios that supports FM processing and an external circuit that supports base band processing, in accordance with an embodiment of the invention.

FIG. 1C is a block diagram of an exemplary single chip with integrated Bluetooth transceiver, FM receiver and FM transmitter that supports FM processing and an exemplary external device that supports base band processing for Bluetooth and FM, in accordance with an embodiment of the invention. Referring to FIG. 1C, there is shown a single chip 112 that supports Bluetooth and FM radio operations and an external device 114. The single chip 112 may comprise an integrated Bluetooth transceiver 116, an integrated FM receiver 118, and an integrated processor 120. The Bluetooth transceiver 116 may comprise suitable logic, circuitry, and/or code that enable Bluetooth signal communication via the single chip 112. In this regard, the Bluetooth transceiver 116 may support audio signals and/or data communication. The FM receiver 118 may comprise suitable logic, circuitry, and/or code that may enable FM signal reception via the single chip 112.

The integrated processor 120 may comprise suitable logic, circuitry, and/or code that may enable processing of control data received from the FM receiver 116 and the Bluetooth transceiver 118. Moreover, the integrated processor 120 may comprise suitable logic, circuitry, and/or code that may perform frequency modulation in a digital mode for FM signal transmission via appropriate broadcast channels.

The external device 114 may comprise one or more baseband processors 122. The baseband processors 122 may comprise suitable logic, circuitry, and/or code that may enable processing of Bluetooth data received by the Bluetooth transceiver 116. Moreover, the baseband processors 122 may enable processing of Bluetooth data to be transmitted by the Bluetooth transceiver 116. In this regard, the Bluetooth transceiver 116 may communicate with the baseband processor 122 via the external device 114. The Bluetooth transceiver 116 may communicate with the integrated processor 120.

The baseband processors 122 may comprise suitable logic, circuitry, and/or code that may enable processing of audio and/or data received via the FM receiver 118. In this regard, the FM receiver 118 and the integrated processor 120 may be communicatively coupled with the baseband processors 122 via the external device 114. The FM receiver 118 may communicate with the integrated processor 120.

In addition, the baseband processors 122 may process audio and/or data to be unconverted for transmission by the integrated processor 120. In this regard, the integrated processor 120 may be communicatively coupled with the baseband processors 122 via the external device 114.

Figure 2A:
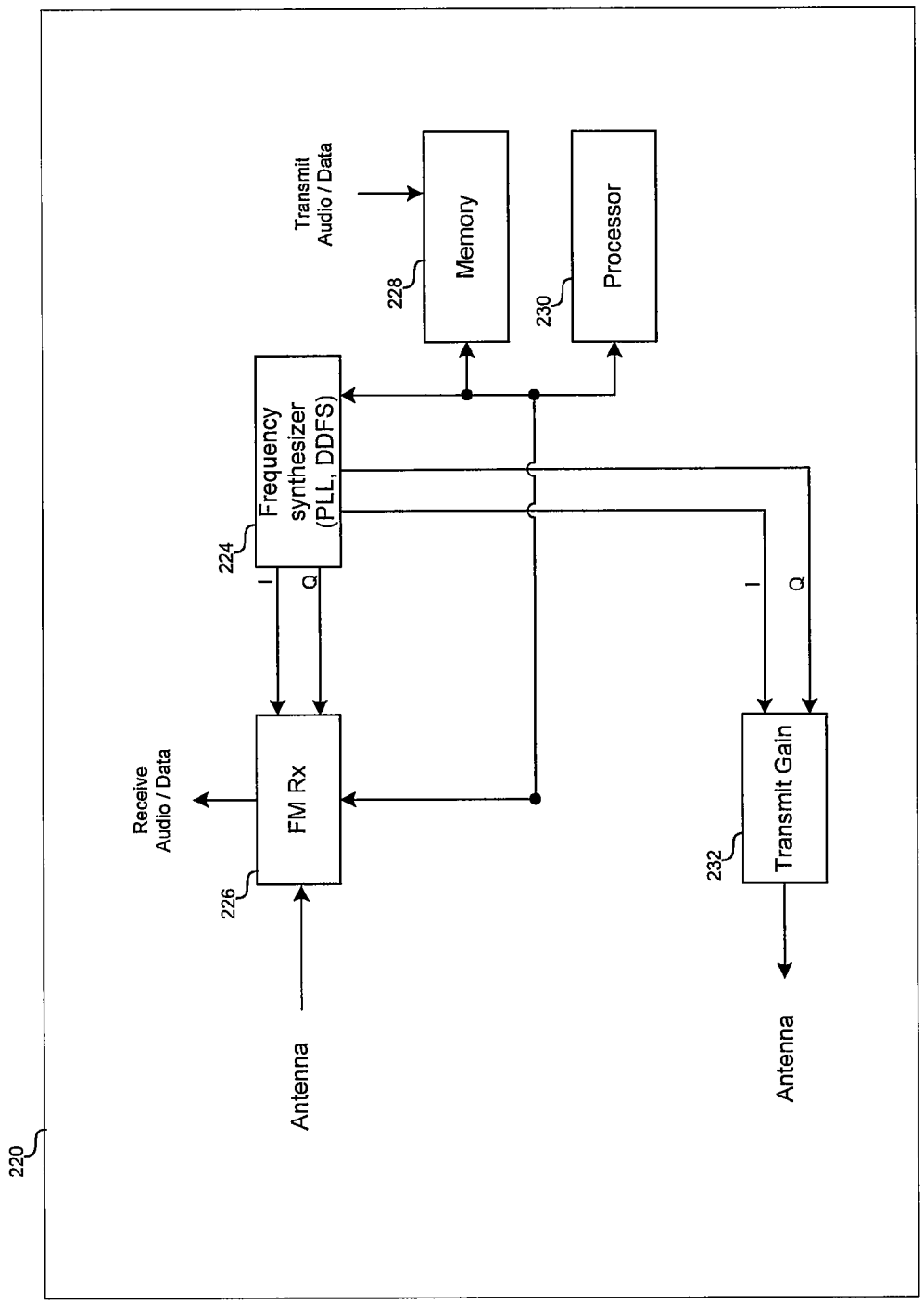
FIG. 2A is an exemplary block diagram of an FM core on an integrated circuit comprising a Bluetooth transceiver, FM receiver and digital circuit for FM transmission signals in accordance with an embodiment of the invention.

FIG. 2A is a block diagram of an exemplary system comprising an FM core for FM transmission (TX) and/or FM reception (RX), in connection with an embodiment of the invention. Referring to FIG. 2A a radio 220 may comprise a frequency synthesizer 224, an FM receive (Rx) block 226, a memory 228, a control processor 230, and a FM transmit (TX) gain block 132.

The frequency synthesizer 224 may comprise suitable logic, circuitry, and/or code that may enable generation of fixed or variable frequency signals. For example, the frequency synthesizers 224 may comprise one or more phase locked loops (PLL) and a direct digital frequency synthesizer (DDFS). Additionally, the frequency synthesizer 224 may comprise, for example, one or more phase shifters and/or signal dividers such that two signals in phase quadrature may be generated.

In another aspect of the invention, the frequency synthesizer block 224 may comprise suitable logic, circuitry, and/or code that may enable transmission of FM signals. In this regard, the frequency synthesizer block may cycle in time between, FM transmission and FM reception operations in a time division duplex (TDD) pattern. During the FM transmission cycle, the frequency synthesizer block 224 may perform digital frequency modulation about a carrier frequency suitable for FM transmission utilizing digital baseband audio/data information.

The frequency synthesizer block 224 may convert the digitally modulated signal to an analog signal. For example, an analog signal within an "FM broadcast transmission band", or approximately within 78 MHz to 100 MHz may be generated. Additionally, the FM frequency synthesizer block 224 may be communicatively coupled with a TX gain block 232 that may condition the FM analog signal such that the signal may be suitable for transmission via an antenna.

The memory 228 may comprise suitable logic circuitry and/or code that may enable storing information. In this regard, the memory 228 may, for example, enable storing information utilized for controlling and/or configuring the frequency synthesizer 224. For example, the memory may store the value of state variables that may be utilized to control the frequency output of the frequency synthesizers 224. Additionally, the memory 228 may enable storing information that may be utilized to configure the FM Rx block 226. In this regard, the FM RX block 226 may comprise logic, circuitry, and/or code such as a filter, for example that may be configured based on the desired frequency of operation.

The control processor 230 may comprise suitable logic, circuitry, and/or code that may enable interfacing to the memory 228, the frequency synthesizer 224 and the FM Rx block 226. In this regard, the control processor 230 may be enabled to execute one or more instructions that enable reading and/or writing to/from the memory 228. Additionally, the control processor 230 may be enabled to execute one or more instruction that may enable providing one or more control signals to the frequency synthesizer 224 and the FM Rx block 226.

The FM Rx block 226 may comprise suitable logic, circuitry, and/or code that may enable reception of FM signals. In this regard, the FM Rx block 226 may be enabled to tune to a desired channel, amplify received signals, down-convert received signals, and/or demodulate received signals to, for example, output data and/or audio information comprising the channel. For example, the FM Rx block 226 may utilize phase quadrature local oscillator signals generated by frequency synthesizer 224 to down-convert received FM signals. The FM Rx block may, for example, be enabled to operate over the "FM broadcast band", or approximately 78 MHz to 100 Mhz. Signal processing performed by the FM Rx block 226 may be preformed entirely in the analog domain, or the FM Rx block 126 may comprise one or more analog to digital converters and/or digital to analog converters.

The TX gain block 232 may comprise suitable logic, circuitry, and/or code that may enable transmission of FM signals. In this regard, the TX gain block 232 may enable buffering and/or amplifying a FM signal such that the signal may be transmitted via an antenna.

The FM Rx block 226 and the TX gain block 232 may share an antenna or utilize separate antennas. In the case of a shared antenna, a directional coupler, transformer, or some other circuitry may be utilized to couple the Tx output and Rx input to the single antenna. Additionally, any antennas utilized by the FM TX gain block 232 and/or the FM Rx block 226 may be integrated into the same substrate as the system 220 or may be separate.

In an exemplary operation of the system 220, one or more signals provided by the control processor 230 may configure the system 220 to either transmit or receive FM signals. To receive FM signals the control processor 230 may provide one or more control signals to frequency synthesizer 224 in order to generate appropriate LO frequencies for reception and digitally modulated signals for transmission. In this regard, the processor may interface to the memory 228 in order to determine the appropriate state of any control signals provided to the frequency synthesizers 224. In this manner, the transmit frequency and receive frequency may be determined in a TDD pattern.

Figure 2B:
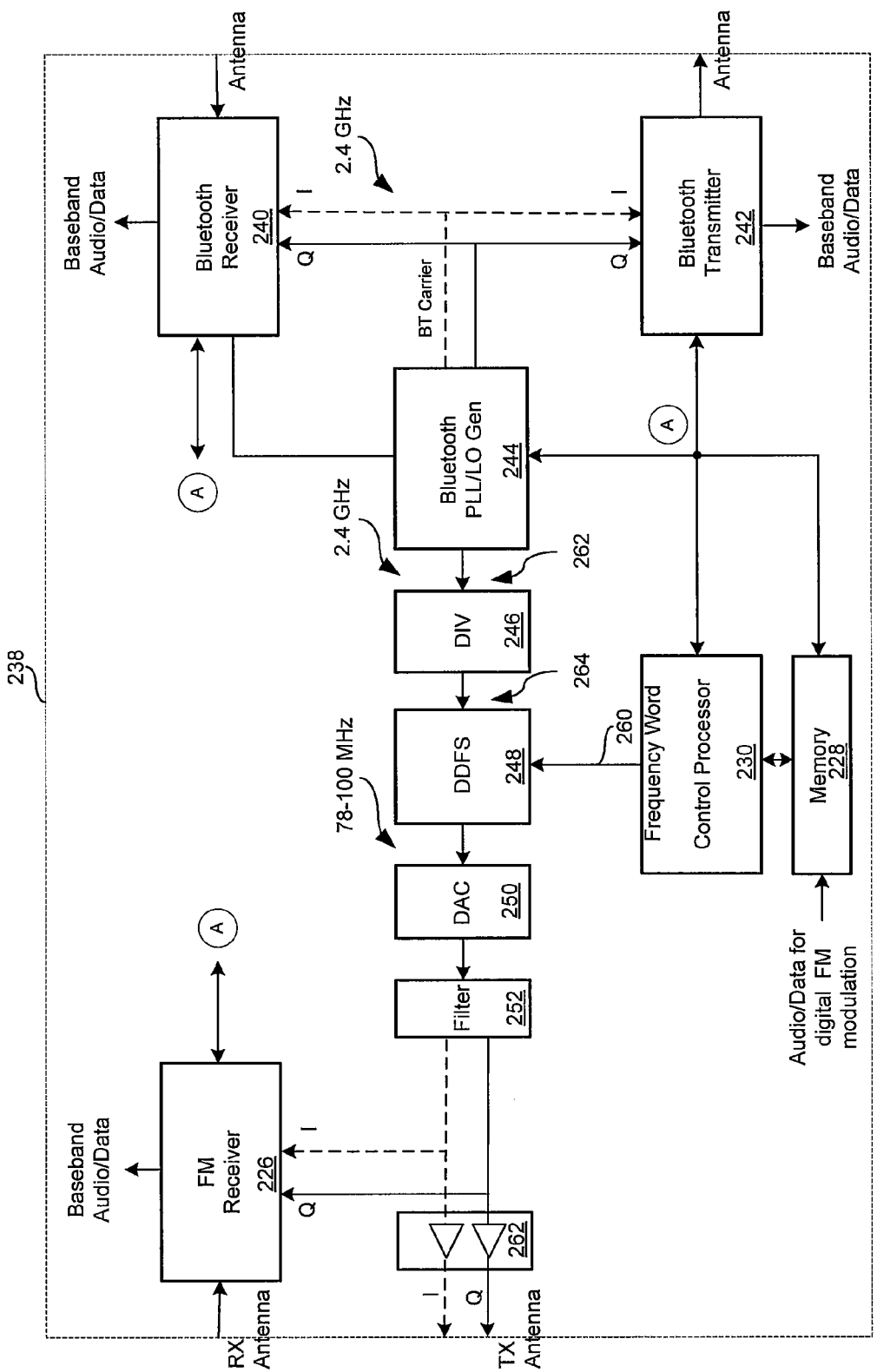
FIG. 2B is an exemplary block diagram of a Bluetooth transceiver and FM receiver and digital circuit for FM transmission signals utilizing an integrated clock generator, in accordance with an embodiment of the invention.

FIG. 2B is a diagram illustrating an exemplary system comprising a Bluetooth (BT) transceiver, a frequency modulated (FM) receiver and an FM digital domain transmitter on a single integrated circuit 238 in accordance with an embodiment of the invention. Referring to FIG. 2B, there is shown an integrated circuit 238, a Bluetooth (BT) receiver 240, a Bluetooth transmitter 242, a BT phase-locked loop (PLL) and local oscillator generator (LOGEN), (BT PLL/LOGEN) circuit 244, a frequency divider 246, a direct digital frequency synthesizer (DDFS) 248, a digital to analog converter (DAC) 250, a filter 252, an FM receiver 226, a transmit gain stage 232, a control processor 230 and a memory 228.

The blocks shown in FIG. 2B: FM receiver 226 and a transmit gain stage 232, are substantially the same as those illustrated in FIG. 2A and described above.

The BT receiver 240 and BT transmitter 242 may comprise suitable logic, circuitry, and/or code that may enable communication with an external BT device for example a cellphone and headset as shown in FIG. 1A. In this regard, the BT receiver and transmitter circuits may comprise a mixer, one or more filters and amplifiers. The BT receiver 240 and BT transmitter 242 may share an antenna or utilize separate antennas. In the case of a shared antenna, a directional coupler, transformer, or some other circuitry may be utilized to couple the TX output and Rx input to the single antenna. Additionally, any antennas utilized by the BT receiver 240 and/or the BT transmitter 242 may be integrated into the same substrate as shown in the system 238 or may be separate.

The BT receiver 240 and transmitter 242 signals may undergo frequency hopping on a plurality of BT carrier frequencies within for example, the frequency band 2.4 GHz to 2.4835 GHz. The frequency band and plurality of carrier frequencies may be different and may depend on geographic location.

The BT receiver 240 may be communicatively coupled with the BT PLL/LOGEN 244. Information comprising frequency and/or phase of a received BT signal may be exchanged with the BT PLL/LOGEN 244. Subsequently, the BT PLL/LOGEN 244 may output a BT carrier signal for modulation and/or demodulation within the BT receiver and BT transmitter. The BT carrier signal may comprise in-phase (I) and quadrature (Q) components. The BT receiver 240 may be communicatively coupled with a baseband processor that may be located on an external circuit as shown in FIG. 1C. The BT receiver 232 may send data or audio signals to the baseband processor for signal processing subsequent to demodulation of the received BT signal. In another aspect of the invention, the BT receiver 240 may exchange operational control information with the control processor 230.

The BT transmitter 242 may comprise suitable logic, circuitry, and/or code that may enable transmission of BT signals. The BT transmitter 242 may be communicatively coupled with the BT PLL/LOGEN 244. The BT transmitter 242 may modulate the I and Q BT carrier signals from the BT PLL/LOGEN 244 with audio and/or data information received from a baseband processor for transmission. The baseband processor may be located on an external circuit as shown in FIG. 1C. In another aspect of the invention, the BT transmitter 242 may exchange operational control information with the control processor 230.

The BT PLL/LOGEN circuit 244 may be communicatively coupled with the BT receiver 240, BT transmitter 242, the frequency divider 246, the processor 256, the memory 260 and the FM receiver 258. The BT PLL/LOGEN may comprise suitable logic, circuitry, and/or code that may enable generation of a variable clock frequencies. For example, the BT PLL/LOGEN circuit 244 may generate 2.4 GHz that serve as local oscillator signals for modulation/demodulation in the BT transceiver. The 2.4 GHz signal from the BT PLL/LOGEN circuit 244 may be output as a clock signal 262 for the synthesis of FM signals in the DDFS 248. The clock signal 262 may be sent to a divider circuit 246. In another aspect of the invention, the BT PLL/LOGEN circuit 244 may exchange operational control information with the control processor 230.

The divider circuit 246 may be configurable to implement frequency division of the clock signal 262. The divider circuit 246 may receive the clock signal 262 from the BT PLL/LOGEN circuit 244 having a frequency, $f_{BT\_LO}$, and output a signal, DIV 264 having a frequency $$f_{DIV}: f_{DIV} = \frac{f_{BT\_LO}}{N} \quad [1]$$

where N may represent a configurable scale factor utilized by the divider circuit 246. The divider circuit 246 may send the signal DIV to a DDFS circuit 248.

The DDFS 248 may comprise suitable logic, circuitry and/or code that may enable it to receive a clock signal as input, for example the DIV signal 264 or a signal directly from the BT PLL/LOGEN 244, and subsequently output a signal with a frequency between zero and near one half the frequency of the input clock signal.

An exemplary input clock signal, DIV 264, may be a sinusoidal signal for which the corresponding period may be equal to the inverse of the frequency, ($1/f_{DIV}$). A process of converting the DIV signal 264 input to a sequence of binary numbers may comprise analog to digital conversion (ADC) whereby each distinct voltage, current and/or power level associated with the received DIV signal 264 may be represented as a binary number selected from a plurality of binary numbers. In this regard, each binary number may correspond to a range of voltage, current and/or power levels in the received DIV signal.

The DDFS 248 output signal frequency may determined by one or more frequency control words 260 from a control processor 230. In this regard, a frequency control word sent to the DDFS together with one or more clock signals 262, may control a frequency and/or phase of a corresponding DDFS output signal 266. The frequency control word 260 may be adjusted to maintain a near constant phase and/or frequency output in spite of changes in clock signal input.

For example, the frequency of a clock signal 264, may vary according to BT frequency hopping. A frequency control word from processor 230 may compensate for the variations in frequency and make further adjustment such that the DDFS output frequency may conform to the frequency and phase requirements of FM signal transmissions. In this regard, the frequency control word may serve to down convert the input clock signal 264 frequency to within a range of 78 MHz to 100 MHz and tune the frequency to an FM carrier. During an FM receive cycle, the FM carrier may be sent to the FM receiver 226 and utilized for demodulation operations as described for the system shown in FIG. 2A.

In another aspect of the invention, during an FM transmit cycle, the frequency control word may further serve to digitally modulate the FM carrier with audio and/or data information received from an external baseband processor. In this regard the DDFS output signal may alternate between generating a carrier signal for the FM receiver and a digitally modulated signal for FM transmission in a TDD pattern as described for the system shown in FIG. 2A.

The DAC 250 may comprise suitable logic, circuitry and/or code that may enable generation of an analog output signal based on a received sequence of input binary numbers. The DAC may generate a corresponding analog voltage level for each input binary number. The number of distinct analog voltage levels may be equal to the number of distinct binary numbers in the input sequence.

The filter circuit may comprise suitable logic, circuitry and/or code that may enable low pass filtering (LPF) of signal components contained in a received input signal. The LPF may enable smoothing of the received input signal to attenuate amplitudes for undesirable frequency components contained in the received input signal. The filter circuit may generate a signal, FM_X having a frequency $f_{FM}$, in the FM frequency band. In an exemplary embodiment of the invention, the range of frequencies may comprise 78 MHz$\leq f_{FM} \leq$100 MHz. The signal FM_X may be a quadrature signal comprising I and Q signal components. The 78-100 MHz I and Q signals may be sent to an FM RX circuit.

The control processor 230 may interface with the memory 228 to determine the appropriate state for any operational control signals and the appropriate value of the frequency control word 260. The processor 230 may provide a plurality of frequency control words 260 to the DDFS in order to generate FM carrier signals for the FM receiver 226 and generate FM digitally modulated transmit signals. In addition, the control processor 230 and the memory 228 may receive FM receiver 226 signal frequency and/or phase information as a reference. In another aspect of the invention, the processor 230 and the memory 228 may provide control signals to power up and down, active components on the integrated circuit.

In operation, the BT PLL/LOGEN 244 may generate a 2.4 GHz clock signal with I and Q components and distribute that signal to the BT receiver 240, the BT transmitter 242 and either the divider 246 or directly to the DDFS 248. Accordingly, the BT receiver 240 may utilize the BT clock signals to demodulate BT signals received from an external device via an antenna and then forward a demodulated signal to a baseband processor which may be located on an external circuit. In addition, the BT transmitter 242 may modulate the BT clock signals with baseband information received from a baseband processor which may be located on an external circuit. A modulated BT signal may then be transmitted via antenna to an external BT device.

In another aspect of the invention, a 2.4 GHz clock signal distributed by the BT PLL/LOGEN 244 may be received by the divider 246 to be down converted to a frequency that may be less than, twice the highest frequency that the DDFS 248 is capable of handling appropriately. Accordingly, the DDFS receives a clock signal from either of the divider 246 or directly from the BT PLL/LOGEN 244. The clock signal utilized by DDFS 248 may be converted from analog to digital. The frequency of the digital clock signal may be adjusted by the DDFS such that a signal output from DDFS 248 has a frequency and phase that conforms to the requirements of FM transmission and reception.

FM operations may cycle in time between transmission and reception in a time division duplex pattern. Accordingly, during an FM receive cycle, the DDFS may utilize a frequency control word from a control processor 230 and one or more clock signals to digitally generate a carrier signal within the range of 78 MHz to 100 MHz for the FM receiver 226. The carrier signal output from DDFS 248 may be converted from digital to analog in the DAC 250. Subsequently, the signal may be shaped by the filter 252 and sent to the FM receiver 226. The FM receiver 226 may utilize the carrier signal to demodulate FM signals received from an external device via an antenna and forward the demodulated signals to a baseband processor that may be located on an external circuit.

During an FM transmit cycle, the DDFS may utilize a frequency control word from a control processor 230 and one or more clock signals to digitally generate a modulated transmit signal within the range of 78 MHz to 100 MHz. The modulated transmit signal output from DDFS 248 may be converted from digital to analog in the DAC 250. Subsequently, the modulated transmit signal may be shaped by the filter 252 and sent to the transmit gain stage 232. The transmit gain stage 232 may amplify the modulated transmit signal and couple the signal to an antenna for transmission to an external device.

In another aspect of the invention, the control processor 230 may exchange information with one or more active components within the circuit 238 in order to control operations and reduce power consumption.

Figure 3:
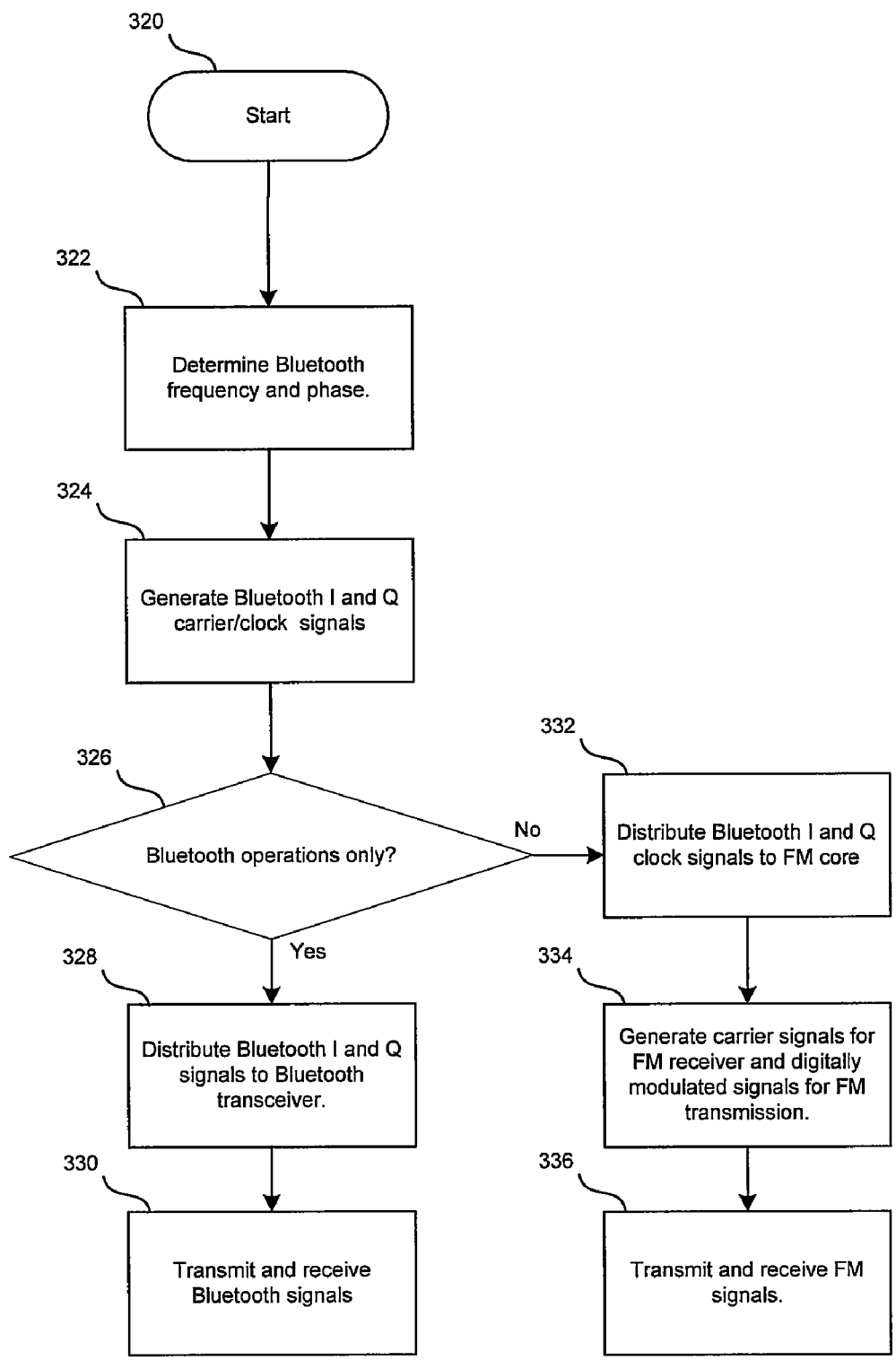
FIG. 3 is a flow chart illustrating a method of wireless communication using an integrated clock generator in Bluetooth and FM transmit and receive circuits, in accordance with an embodiment of the invention.

FIG. 3 is a flow chart illustrating exemplary steps in transmission and reception of BT signals utilizing a BT PLL/LOGEN 244 and/or FM signals utilizing the BT PLL/LOGEN 244 and a DDFS 248 in accordance with an embodiment of the invention. In this regard, one or more of the exemplary steps shown in FIG. 3 may be performed by the integrated circuit 238 illustrated in FIG. 2B. Referring to FIG. 3 the step 320 is a starting point for the flow of steps. In step 322, an appropriate frequency to generate for Bluetooth communications may be determined. For example, at start-up, the control processor 230 described in FIG. 2B may read a default frequency setting from the memory 228.

In step 324, the BT PLL/LOGEN 244 may generate a BT carrier/clock signal with I and Q components. In step 326, if the integrated circuit is performing only BT operations, the process may proceed to step 328. In step 328, the BT carrier/clock signal may be distributed to the BT receiver 240. In step 330, the BT carrier signal may be utilized by the BT receiver 240 to demodulate BT signals received from an external device via an antenna. In addition, the BT carrier signal may be modulated by audio and/or data from an external baseband processor circuit and transmitted via antenna to an external BT device.

In step 326, if the integrated circuit 238 is performing FM operations, the process may proceed to step 332. In step 332, a BT carrier/clock signal may for example be distributed to a frequency divider 246 or otherwise, directly to a DDFS 248 when the frequency is within a range appropriate for the DDFS. In step 334, the DDFS 248 may cycle in time between digitally generating signals for transmission and reception, in a time division duplex pattern. During a receive cycle, the DDFS 248 may generate a carrier signal which may then be forwarded to a DAC 250 for digital to analog conversion, the output of the DAC filter 252 may be forwarded to a filter 252 for signal shaping and the output of the filter may be forwarded to an FM receiver 226. During a transmit cycle, the DDFS may digitally generate a modulated FM signal which may then be forwarded to the DAC 250 for digital to analog conversion, the output of the DAC filter 252 may be forwarded to the filter 252 for signal shaping and the output of the filter may be forwarded to the transmit gain stage 232.

In step 336, during a receive cycle, the FM receiver may utilize the FM carrier signal to demodulate BT signals received via an antenna and forward output to a baseband processor that may be located on an external circuit. During a transmit cycle the transmit gain stage may amplify the modulated FM signal and couple the signal to an antenna for transmission.

The method and system disclosed in FIGS. 1A, 1B, 1C, 2A, 2B and 3 may be an integrated circuit in a device that enables transmission and reception of Bluetooth signals as well as FM signals. One or more clock signals may be generated and utilized to enable Bluetooth transmission and reception. The clock signals may be generated via a phase-locked loop which may operate at a frequency hopping Bluetooth frequency.

A direct digital frequency synthesizer (DDFS) may utilize the clock signals and one or more frequency control words to generate an FM carrier signal that enables FM reception. Moreover, the DDFS may utilize the clock signals and frequency control words to generate a modulated signal for FM transmission. Accordingly, the FM transmission and reception are time division duplex.

A generated frequency control word may control the generation of an FM carrier via the DDFS. In this regard, the frequency control word may be adjusted to compensate for variations in the frequency of the clock signal.

In another aspect of the invention, a generated frequency control word may control the generation of an FM modulated signal via the DDFS. In this regard, the frequency control word may be adjusted to compensate for variations in the frequency of the clock signal as well as to modulate a signal about a frequency of an FM carrier. Moreover, each of the clock signals, carrier signals and modulated signals comprise an in-phase component and a quadrature-phase component.

Certain embodiments of the invention may comprise a machine-readable storage having stored thereon, a computer program having at least one code section for integrated Bluetooth transceiver, FM transmitter and FM receiver, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for generating communication signals on an integrated circuit, the method comprising:
   generating one or more clock signals that enable transmission of Bluetooth signals and reception of Bluetooth signals;
   generating via a direct digital frequency synthesizer (DDFS), one or more carrier signals utilizing said one or more clock signals and one or more frequency control words to enable reception of FM signals; and
   generating via said DDFS, one or more modulated signals utilizing said one or more clock signals and said one or more frequency control words to enable transmission of FM signals, wherein said reception of said FM signals and said transmission of said FM signals are time division duplex.

2. The method according to claim 1, comprising generating said one or more frequency control words for input to said DDFS that controls said generation of said one or more carrier signals.

3. The method according to claim 2, comprising adjusting said one or more frequency control words input to said DDFS, which control said generation of said one or more carrier signals, to compensate for variations in a frequency of said one or more clock signals.

4. The method according to claim 1, comprising generating said one or more frequency control words for input to said DDFS that controls said generation of said one or more modulated signals by said DDFS.

5. The method according to claim 4, comprising adjusting said one or more frequency control words input to said DDFS, which control said generation of said one or more modulated signals, to compensate for changes in a frequency of said one or more clock signals.

6. The method according to claim 4, comprising adjusting said one or more frequency control words input to said DDFS, which control said generation of said one or more modulated signals, to enable digital frequency modulation about a frequency of said one or more carrier signals utilizing audio and/or data information.

7. The method according to claim 1, wherein each of said one or more clock signals, said one or more carrier signals and said one or more modulated signals comprises an in-phase component and a quadrature-phase component.

8. The method according to claim 1, comprising generating said one or more clock signals via a phase locked loop.

9. The method according to claim 8, wherein said phase locked loop operates at a frequency hopping Bluetooth frequency.

10. A system for generating communication signals on an integrated circuit, the system comprising:
    one or more circuits that is operable to:
    generate one or more clock signals for transmission of Bluetooth signals and reception of Bluetooth signals;
    generate via a direct digital frequency synthesizer (DDFS), one or more carrier signals utilizing said one or more clock signals and one or more frequency control words to enable reception of FM signals;
    generate via said DDFS, one or more modulated signals utilizing said one or more clock signals and said one or more frequency control words to enable transmission of FM signals, wherein said reception of said FM signals and said transmission of said FM signals are time division duplex.

11. The system according to claim 10, wherein said one or more circuits is operable to generate said one or more frequency control words for input to said DDFS that controls said generation of said one or more carrier signals.

12. The system according to claim 11, wherein said one or more circuits is operable to adjust said one or more frequency control words input to said DDFS, which control said generation of said one or more carrier signals, to compensate for variations in a frequency of said one or more clock signals.

13. The system according to claim 10, wherein said one or more circuits is operable to generate said one or more frequency control words for input to said DDFS that controls said generation of said one or more modulated signals by said DDFS.

14. The system according to claim 13, wherein said one or more circuits is operable to adjust said one or more frequency control words input to said DDFS, which control said generation of said one or more modulated signals, to compensate for variations in a frequency of said one or more clock signals.

15. The system according to claim 13, wherein said one or more circuits is operable to adjust said one or more frequency control words input to said DDFS, which control said generation of one or more modulated signals, to enable digital frequency modulation about a frequency of said one or more carrier signals utilizing audio and/or data information.

16. The system according to claim 10, wherein each of said one or more clock signals, said one or more carrier signals and said one or more modulated signals comprises an in-phase component and a quadrature-phase component.

17. The system according to claim 10, wherein said one or more circuits comprise a phase locked loop that generate said one or more clock signals.

18. The system according to claim 17, wherein said phase locked loop operates at a frequency hopping Bluetooth frequency.

19. A non-transitory machine-readable storage having stored thereon, a computer program having at least one code section for generating communication signals on an integrated circuit, the at least one code section being executable by a machine for causing the machine to perform steps comprising:
   generating one or more clock signals that enable transmission of Bluetooth signals and reception of Bluetooth signals;
   generating via a direct digital frequency synthesizer (DDFS), one or more carrier signals utilizing said one or more clock signals and one or more frequency control words to enable reception of FM signals; and
   generating via said DDFS, one or more modulated signals utilizing said one or more clock signals and said one or more frequency control words to enable transmission of FM signals, wherein said reception of said FM signals and said transmission of said FM signals are time division duplexed.

20. The non-transitory machine-readable storage according to claim 19, wherein said at least one code section comprises code for generating said one or more frequency control words for input to said DDFS that controls said generation of said one or more carrier signals.

21. The non-transitory machine-readable storage according to claim 20, wherein said at least one code section comprises code for adjusting said one or more frequency control words input to said DDFS, which control said generation of said one or more carrier signals, to compensate for variations in a frequency of said one or more clock signals.

22. The non-transitory machine-readable storage according to claim 19, wherein said at least one code section comprises code for generating said one or more frequency control words for input to said DDFS that controls said generation of said one or more modulated signals by said DDFS.

23. The non-transitory machine-readable storage according to claim 22, wherein said at least one code section comprises code for adjusting said one or more frequency control words input to said DDFS, which control said generation of said one or more modulated signals, to compensate for variations in a frequency of said one or more clock signals.

24. The non-transitory machine-readable storage according to claim 22, wherein said at least one code section comprises code for adjusting said one or more frequency control words input to said DDFS, which control said generation of said one or more modulated signals, to enable digital frequency modulation about a frequency of said one or more carrier signals utilizing audio and/or data information.

25. The non-transitory machine-readable storage according to claim 19, wherein each of said one or more clock signals, said one or more carrier signals and said one or more modulated signals comprises an in-phase component and a quadrature-phase component.

26. The non-transitory machine-readable storage according to claim 19, wherein said at least one code section comprises code for generating said one or more clock signals via a phase locked loop.

27. The non-transitory machine-readable storage according to claim 19, wherein said phase locked loop operates at a frequency hopping Bluetooth frequency.

* * * * *